(12) United States Patent
Schlueter

(10) Patent No.: US 9,829,528 B2
(45) Date of Patent: Nov. 28, 2017

(54) MEASURING INSTRUMENT

(71) Applicant: Schluter Systems L.P., Plattsburgh, NY (US)

(72) Inventor: Werner Schlueter, Iserlohn (DE)

(73) Assignee: Schluter Systems L.P., Plattsburgh, NY (US)

( * ) Notice: Subject to any disclaimer, the term of this patent is extended or adjusted under 35 U.S.C. 154(b) by 43 days.

(21) Appl. No.: 14/661,359

(22) Filed: Mar. 18, 2015

(65) Prior Publication Data

US 2015/0268288 A1   Sep. 24, 2015

(30) Foreign Application Priority Data

Mar. 21, 2014 (DE) .................. 10 2014 103 910

(51) Int. Cl.
*G01R 31/02* (2006.01)
*G01R 27/00* (2006.01)

(52) U.S. Cl.
CPC .................. *G01R 31/021* (2013.01)

(58) Field of Classification Search
CPC .................................................. G01R 31/021
See application file for complete search history.

(56) References Cited

U.S. PATENT DOCUMENTS

| 6,300,598 B1* | 10/2001 | Chiles | H05B 1/0277 |
| | | | 219/213 |
| 9,024,769 B2* | 5/2015 | Hong | G01R 31/025 |
| | | | 340/636.1 |
| 2009/0128126 A1* | 5/2009 | Garland | G01R 15/125 |
| | | | 324/115 |

FOREIGN PATENT DOCUMENTS

| DE | 40 37 115 A1 | 5/1992 |
| DE | 10 2005 042 423 B4 | 3/2007 |
| DE | 20 2013 006 095 U1 | 7/2013 |

OTHER PUBLICATIONS

German Search Report in 10 2014 103 910.6, dated Nov. 26, 2014, with English translation of relevant parts.

* cited by examiner

*Primary Examiner* — David M Gray
*Assistant Examiner* — Michael Harrison
(74) *Attorney, Agent, or Firm* — Thorpe North & Western, LLP

(57) ABSTRACT

A measuring instrument and a method checks the functional capability of an electric heating wire of a surface heating system before it is installed and indicates damage to the heating wire while it is being installed. The instrument includes a power supply, connecting devices electrically connected to the power supply and to which the free ends of an electric heating wire can be connected such as to form a current circuit on the power supply, a resistance measuring device designed to record the electric resistance of a heating wire connected to the power supply, a display device which displays an electric resistance of a heating wire recorded by the resistance measuring device, and a warning device designed to emit an acoustic signal when the electric resistance of a heating wire recorded by the resistance measuring device strays from a target value range defined by the measuring instrument.

17 Claims, 1 Drawing Sheet

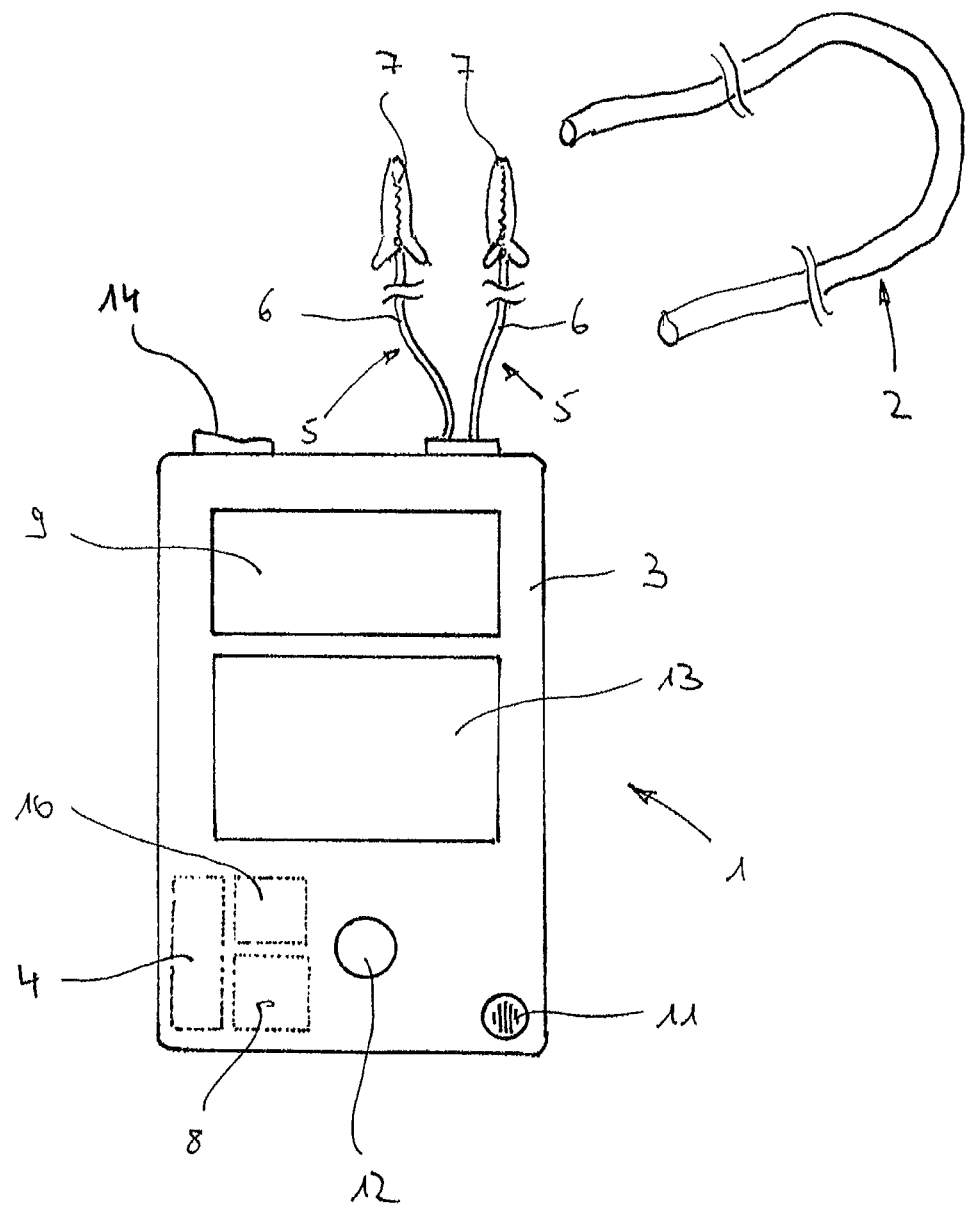

MEASURING INSTRUMENT

CROSS REFERENCE TO RELATED APPLICATIONS

Applicant claims priority under 35 U.S.C. §119 of German Application No. 10 2014 103 910.6 filed Mar. 21, 2014, the disclosure of which is incorporated by reference.

BACKGROUND OF THE INVENTION

1. Field of the Invention

The present invention relates to a measuring instrument for checking the functional capability of an electric heating wire of a surface heating system before it is installed and for indicating damage to the heating wire while it is being installed, comprising a power supply, connecting devices electrically connected to the power supply and to which the free ends of an electric heating wire can be connected such as to form a current circuit on the power supply, a resistance measuring device which is designed to record the electric resistance of a heating wire connected to the power supply, and a display device which displays an electric resistance of a heating wire recorded by the resistance measuring device. Furthermore, the present invention relates to a method for checking the functional capability of an electric heating wire of a surface heating system before it is installed and for indicating damage to the heating wire while the latter is being installed by using this type of measuring instrument.

2. Description of the Related Art

Electric surface heating systems are known from the prior art in a wide variety of configurations. They comprise at least one heating wire that can be incorporated into a heating mat by the manufacturer. The heating wire is normally installed in a mortar or thin bed mortar layer disposed immediately beneath the floor covering during installation, and for this reason very fast response times can be achieved by the heating. Another advantage of electric surface heating systems is that they mostly have a very low structure, and for this reason they can be retrofitted with very little effort, for example within the framework of the renovation of an old building or the like.

One basic prerequisite for the correct operation of an electric surface heating system is that the heating wire used functions correctly, i.e. it is not damaged. Since the subsequent replacement of a heating wire is associated with a lot of effort and high costs due to it being embedded in said mortar layer, it is recommended to check the correct function of the heating wire before installing it. In addition, the functional capability of the heating wire should also be monitored during installation in order to ensure that the heating wire is not inadvertently damaged while being installed.

In order to check the correct functioning of a heating wire a commercially availably continuous tester that measures the electric resistance of the heating wire can in principle be used. If the electric resistance of the heating wire comes within a previously defined target value range, correct function is guaranteed. A commercially available continuous tester comprises a power supply, connecting devices connected electrically to the power supply and to which the free ends of an electric heating wire can be connected such as to form a current circuit on the power supply, a resistance measuring device which is designed to record the electric resistance of a heating wire connected to the power supply, and a display device which displays an electric resistance of a heating wire recorded by the resistance measuring device.

However, a problem associated with commercially available continuous testers is that their handling is very confusing for a layman. This is due to the fact that commercially available continuous testers have a plurality of setting options in order to guarantee the most flexible possible applicability to a wide variety of technical domains. Another disadvantage of commercially available continuous testers is that, if the continuous tester is used to monitor the functional capability of a heating wire while it is being installed, the display device must be constantly observed by an installer so that, if the heating wire is damaged, he can quickly determine the associated decrease in electric resistance.

SUMMARY OF THE INVENTION

On the basis of this prior art it is an object of the present invention to devise an alternative measuring instrument and an alternative method for checking the functional capability of an electric heating wire of a surface heating system before it is installed and for indicating damage to the heating wire while it is being installed.

In order to achieve this object the present invention provides a measuring instrument of the type specified at the start which has a warning device which is designed such that it emits an acoustic signal as soon as the electric resistance of a heating wire recorded by the resistance measuring device strays from a target value range defined by the measuring instrument. Similarly to a conventional continuous tester, the measuring instrument according to the invention can be used to check the functional capability of a heating wire before it is installed by the free ends of the heating wire being connected to the power supply of the measuring instrument using the connecting devices. By means of the resistance measuring device the electric resistance of the heating wire is then determined and displayed using the display device. The displayed value can then be compared to a target value range by a user. If the displayed electric resistance of the heating wire comes within the target value range, one can start installing the heating wire, the heating wire remaining connected to the power supply of the measuring instrument during installation. An essential advantage of the measuring instrument according to the invention is now that the installers of the surface heating system are alerted by an acoustic signal emitted by the warning device during the installation work as soon as the electric resistance of the heating wire recorded by the resistance measuring device strays from the target value range defined by the measuring instrument due to damage. By virtue of the acoustic signal issued by the warning device in the event of damage it is not necessary for a person to keep an eye on the display device of the measuring instrument during the whole installation. In fact, all of the installers can commit themselves to the actual installation without worrying about a non-functional heating wire being installed. As a result, the measuring instrument according to the invention is easy and convenient to use and guarantees a correct working result.

According to one configuration of the present invention the power supply is in the form of at least one battery. Accordingly, an external energy source is not required.

Preferably, the connecting devices each have a crocodile clip. Such crocodile clips are advantageous in that they enable simple and convenient connection of a heating wire to the power supply.

The display device is advantageously in the form of a display. In principle it is quite sufficient if this type of display only displays the electric resistance that is recorded by the resistance measuring device of the measuring instrument.

According to one configuration of the present invention a manually operable activation device activating the warning device is provided which is preferably in the form of a pressure switch. This type of activation device, in particular in the form of a simple pressure switch, enables very easy handling of the measuring instrument according to the invention. Thus, the activation device only needs to be actuated after it has been established, prior to the start of installation, that the electric resistance of the heating wire comes within predetermined limit values and is accordingly functioning correctly. Following actuation of the activation device the measuring instrument is then passed into a monitoring mode. During the monitoring mode it is checked whether the electric resistance of the heating wire strays from the target value range stored in the measuring instrument. If this is the case, the acoustic signal is automatically emitted as a warning signal.

Preferably a table of values is provided which assigns target resistance value ranges to heating wires of different lengths. Also based on such a table of values, a user can assess the functional capability of a heating wire by comparing the electric resistance of a heating wire determined by the resistance measuring device with the values listed in the table of values.

Advantageously, the table of values is contained in instructions for use relating to the measuring instrument and/or is disposed on the measuring instrument in the form of a sticker.

In order to achieve the object specified at the start, the present invention furthermore proposes using a measuring instrument according to the invention to check the functional capability of an electric heating wire of a surface heating system before it is installed and for indicating damage to the heating wire while it is being installed.

Moreover, the present invention provides a method for checking the functional capability of an electric heating wire of a surface heating system before it is installed and for indicating damage to the heating wire while it is being installed by using a measuring instrument according to the invention which comprises the steps: connecting the heating wire to the energy source of the measuring instrument using the connecting devices; recording the electric resistance of the heating wire by using the resistance measuring device; displaying the recorded electric resistance by means of the display device; comparing the displayed electric resistance with a target value range which identifies a functional heating wire; and activating the warning device if the displayed electric resistance of the heating wire comes within the target value range.

BRIEF DESCRIPTION OF THE DRAWINGS

Additional features and advantages of the present invention will become clear from the following description of a measuring instrument according to an embodiment of the present invention with reference to the sole FIGURE which diagrammatically shows a measuring instrument according to an embodiment of the present invention with a heating wire attached to the latter.

DETAILED DESCRIPTION OF PREFERRED EMBODIMENTS

The measuring instrument 1 shown in the FIGURE serves to check the functional capability of an electric heating wire 2 of a surface heating system before it is installed and for indicating damage to the heating wire 2 during installation. The measuring instrument 1 comprises a housing 3 that can be produced, for example, from plastic. A power supply 4, in the form of batteries in this instance, is accommodated within the housing 3. Electrically connected to the power supply 4 are connecting devices 5, and by using the latter an electric heating wire 2 can be connected to the power supply 4 such as to form a current circuit. Each connecting device 5 comprises a cable 6 guided out of the housing 3 and the free end of which is provided with a crocodile clip 7. In principle, the connecting devices 5 can however also have a different structure. Furthermore, accommodated within the housing 3 is a resistance measuring device 8 which is designed to record the electric resistance of a heating wire 2 connected to the power supply 4. Provided on the front side of the housing 3 is a display device 9 in the form of a display, the display device 9 displaying an electric resistance of a heating wire 2 recorded by the resistance measuring device 8 as a numerical value. The measuring instrument 1 further comprises a warning device 10 disposed within the housing 3 which is designed such that it emits an acoustic signal via a loudspeaker 11 as soon as the electric resistance of a heating wire 2 recorded by the resistance measuring device 8 strays from a target value range stored in the measuring instrument 1. Provided on the front side of the housing 3 is a manually actuatable activation device 12 activating the warning device 10 in the form of a pressure switch. Furthermore, positioned on the front side of the housing 3 is a table of values 13 in the form of a label which assigns target resistance value ranges to electric heating wires 2 of different lengths. In addition, there is disposed on the housing 3 an on-off switch 14 with which the measuring instrument 1 can be switched on and off.

In order to check the functional capability of an electric heating wire 2 of a predetermined length by using the measuring instrument 1, in a first step the electric heating wire 2 is connected to the energy source 4 of the measuring instrument using the connecting devices 5. For this purpose the crocodile clips 7 are connected to the free ends of the electric heating wire 2. In a further step, the electric resistance of the heating wire 2 is recorded automatically using the resistance measuring device 8 and the measuring result is displayed in the form of a numerical value by the display device. Next the value displayed by the display device 9 is compared by a user with a target value range which identifies a functional heating wire 2. This target value range is listed in the table of values 13 for the corresponding length of the heating wire 2. If the value of the electric resistance of the heating wire 2 displayed by the display device 9 comes outside of the target value range, the heating wire 2 must be replaced because it is not functioning correctly. The steps described above are then repeated for the new heating wire. If, however, the value displayed by the display device 9 comes within the target value range, the electric heating wire 2 is functioning correctly. In this case the user activates the warning device 10 by actuating the activation device 12. The warning device 10 now monitors the functional capability of the heating wire 2 and emits an alarm signal as soon as the electric resistance of the heating wire 2 ep, e, recorded by the resistance measuring device 8 strays from the predetermined target value range which is defined in the measuring instrument 1. The target value range can define deviations, for example, of ±5%, ±10% or −5 to 10% based on a nominal target value of the electric resistance of a heating wire of a predetermined length. Alternatively, the target value range can also define deviations of ±5% or ±10% based on the electric resistance of the heating wire 2 first of all recorded by the resistance measuring device 8. The target value range is basically to be chosen such that correct functioning of the electric heating wire 2 is guaranteed. Preferably, the target value range is defined by the manufacturer and is stored in the measuring instrument 1. If the warning device 10 emits an alarm signal during installation of an electric heating wire 2 being monitored, this is a sign showing that the electric heating wire 2 has been inadmissibly damaged. In this case the electric heating wire 2 is to be replaced with a new heating wire, whereupon all of the steps described above are to be repeated for the new heating wire. If, however, no warning signal sounds during installation, it can be assumed that the electric heating wire 2 is functioning correctly.

An essential advantage of the measuring instrument 1 is that with the latter, the correct functioning of an electric heating wire 2 can be checked both prior to installation and during installation without any additional aids being required. Moreover, by virtue of the warning device 10 integrated into the measuring instrument 1 the installers are alerted in good time if an electric heating wire 2 being monitored is inadvertently damaged during installation. Accordingly, it is not necessary for an installer to constantly monitor the display device 9 due to the warning signal that sounds if damage occurs. Moreover, the measuring instrument 1 according to the invention is very easy to handle because the measuring instrument 1 only has an on-off switch 14 and an activation device 12. Complicated settings of the measuring instrument 1 that relate to the specific application are not required due to the table of values 13.

LIST OF REFERENCE NUMBERS

1 Measuring instrument
2 Heating wire
3 Housing
4 Power supply
5 Connecting device
6 Cable
7 Crocodile clip
8 Resistance measuring device
9 Display device
10 Warning device
11 Loudspeaker
12 Activation device
13 Table of values
14 On-off switch

What is claimed is:

1. A measuring instrument (1) for checking the functional capability of an electric heating wire (2) of a surface heating system before it is installed and for indicating damage to the heating wire (2) while it is being installed, comprising
a power supply (4), connecting devices (5) electrically connected to the power supply (4) and to which the free ends of an electric heating wire (2) can be connected such as to form a current circuit on the power supply (4), a resistance measuring device (8) which is designed to record the electric resistance of a heating wire (2) connected to the power supply (4), a display device (9) which displays an electric resistance of a heating wire (2) recorded by the resistance measuring device (8), and a warning device (10) which is designed such that it emits an acoustic signal as soon as the electric resistance of a heating wire (2) recorded by the resistance measuring device (8) strays from a target value range defined by the measuring instrument (1) said target value range being −5% to +10% of a nominal target value for a functional electric heating wire.

2. The measuring instrument (1) according to claim 1, wherein the power supply (4) is in the form of at least one battery.

3. The measuring instrument (1) according to claim 1, wherein the connecting devices (5) each have a crocodile clip (7).

4. The measuring instrument (1) according to claim 1, wherein the display device (9) is in the form of a display.

5. The measuring instrument (1) according to claim 1, wherein a manually operable activation device (12) activating the warning device (10) is provided, the activation device including a pressure switch.

6. The measuring instrument (1) according to claim 1, wherein a table of values (13) is provided which assigns target resistance value ranges to heating wires (2) of different lengths.

7. The measuring instrument (1) according to claim 6, wherein the table of values (13) is contained in instructions for use relating to the measuring instrument (1) and/or is disposed on the measuring instrument (1) in the form of a sticker.

8. The use of a measuring instrument (1) according to claim 1 for checking the functional capability of an electric heating wire (2) of a surface heating system before it is installed and for indicating damage to the heating wire (2) while it is being installed.

9. A method for checking the functional capability of an electric heating wire (2) of a surface heating system before it is installed and for indicating damage to the heating wire (2) while it is being installed by using a measuring instrument (1) according to claim 1 which comprises the steps:
connecting the heating wire (2) to the energy source (4) of the measuring instrument (1) using the connecting devices (5);
recording the electric resistance of the heating wire (2) by using the resistance measuring device (8);
displaying the recorded electric resistance by means of the display device (9);
comparing the displayed electric resistance with a target value range which identifies a functional heating wire (2); and
activating the warning device (10) if the displayed electric resistance of the heating wire (2) comes within the target value range.

10. The method of claim 9, wherein the target value range is +/−5% of the nominal target value for the measured heating wire.

11. The measuring instrument of claim 1, wherein the target value range is +/−5% of the nominal target value for a functional electric heating wire.

12. A measuring instrument (1) for checking the functional capability of an electric heating wire (2) of a surface heating system before it is installed and for indicating damage to the heating wire (2) while it is being installed, comprising
a power supply (4), connecting devices (5) electrically connected to the power supply (4) and to which the free ends of an electric heating wire (2) can be connected such as to form a current circuit on the power supply (4), a resistance measuring device (8) which is designed to record the electric resistance of a heating wire (2) connected to the power supply (4), a display device (9) which displays an electric resistance of a heating wire (2) recorded by the resistance measuring device (8), and a warning device (10) which is designed such that it emits an acoustic signal as soon as the electric resistance of a heating wire (2) recorded by the resistance measuring device (8) strays from a target value range defined by the measuring instrument (1), said target value range being +/−10% of a nominal target value for a functional electric heating wire.

13. The measuring instrument (1) according to claim 12, wherein a manually operable activation device (12) activating the warning device (10) is provided, the activation device including a pressure switch.

14. The measuring instrument (1) according to claim 12, wherein a table of values (13) is provided which assigns target resistance value ranges to heating wires (2) of different lengths.

15. The use of a measuring instrument (1) according to claim 12 for checking the functional capability of an electric heating wire (2) of a surface heating system before it is installed and for indicating damage to the heating wire (2) while it is being installed.

16. A method for checking the functional capability of an electric heating wire (2) of a surface heating system before it is installed and for indicating damage to the heating wire (2) while it is being installed by using a measuring instrument (1) according to claim 12 which comprises the steps:

connecting the heating wire (2) to the energy source (4) of the measuring instrument (1) using the connecting devices (5);

recording the electric resistance of the heating wire (2) by using the resistance measuring device (8);

displaying the recorded electric resistance by means of the display device (9);

comparing the displayed electric resistance with a target value range which identifies a functional heating wire (2); and activating the warning device (10) if the displayed electric resistance of the heating wire (2) comes within the target value range.

17. The method of claim 16, wherein the target value range is +/−5% of the nominal target value for the measured heating wire.

* * * * *